(12) United States Patent
Kaushal et al.

(10) Patent No.: US 8,954,184 B2
(45) Date of Patent: Feb. 10, 2015

(54) TOOL PERFORMANCE BY LINKING SPECTROSCOPIC INFORMATION WITH TOOL OPERATIONAL PARAMETERS AND MATERIAL MEASUREMENT INFORMATION

(75) Inventors: Sanjeev Kaushal, San Jose, CA (US); Sukesh Janubhai Patel, Cupertino, CA (US); Kenji Sugishima, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 540 days.

(21) Appl. No.: 13/009,685

(22) Filed: Jan. 19, 2011

(65) Prior Publication Data
US 2012/0185813 A1 Jul. 19, 2012

(51) Int. Cl.
| | |
|---|---|
| G06F 19/00 | (2011.01) |
| G01D 18/00 | (2006.01) |
| H01L 21/66 | (2006.01) |
| G05B 19/418 | (2006.01) |
| H01J 37/32 | (2006.01) |

(52) U.S. Cl.
CPC .......... *H01L 22/20* (2013.01); *G05B 19/41875* (2013.01); *H01J 37/32926* (2013.01); *H01L 22/12* (2013.01); *H01L 22/26* (2013.01)
USPC .............................. 700/121; 700/104; 73/1.01

(58) Field of Classification Search
USPC .................... 700/121, 104; 73/1.01
See application file for complete search history.

(56) References Cited

U.S. PATENT DOCUMENTS

| | | | | |
|---|---|---|---|---|
| 6,782,342 | B2* | 8/2004 | LeGore et al. ................ | 702/181 |
| 7,454,312 | B2* | 11/2008 | Weiher et al. ................ | 702/179 |
| 8,010,321 | B2* | 8/2011 | Lin et al. ...................... | 702/185 |
| 2005/0193800 | A1 | 9/2005 | DeBoer et al. | |
| 2007/0219738 | A1* | 9/2007 | Weiher et al. ................ | 702/82 |
| 2007/0231930 | A1 | 10/2007 | Funk et al. | |
| 2009/0228129 | A1 | 9/2009 | Moyne et al. | |
| 2009/0240366 | A1* | 9/2009 | Kaushal et al. ............... | 700/110 |
| 2010/0138026 | A1 | 6/2010 | Kaushal et al. | |
| 2011/0069312 | A1* | 3/2011 | Kandel et al. ................ | 356/369 |

OTHER PUBLICATIONS

International Search Report for PCT Patent Application No. US12/21614 dated May 8, 2012, 17 pages.

* cited by examiner

*Primary Examiner* — Mohammad Ali
*Assistant Examiner* — Ziaul Karim
(74) *Attorney, Agent, or Firm* — Amin, Turocy & Watson, LLP

(57) ABSTRACT

System(s) and method(s) are provided for adjustment and analysis of performance of a tool through integration of tool operational data and spectroscopic data related to the tool. Such integration results in consolidated data that enable, in part, learning at least one relationship amongst selected portions of the consolidated data. Learning is performed autonomously without human intervention. Adjustment of performance of the tool relies at least in part on a learned relationship and includes generation of process recipe parameter(s) that can adjust a manufacturing process in order to produce a satisfactory tool performance in response to implementation of the manufacturing process. A process recipe parameter can be generated by solving an inverse problem based on the learned relationship. Analysis of performance of the tool can include assessment of synthetic performance scenarios, identification of spectroscopic condition(s) that affect performance, and extraction of endpoints based at least on time dependence spectroscopic data.

19 Claims, 15 Drawing Sheets

| WAFER ID | TIME | PRESSURE | ... | I(λ₁) | I(λ₂) | ... | I(λₙ) | FI-CD(1) | FI-CD(2) | ... | FI-CD(M) |
|---|---|---|---|---|---|---|---|---|---|---|---|
| ID 1 | t₁ | P₁ | ... | I₁,₁ | I₂,₁ | ... | Iₙ,₁ | f₁,₁ | f₂,₁ | ... | fₘ,₁ |
| ID 1 | t₂ | P₂ | ... | I₁,₂ | I₂,₂ | ... | Iₙ,₂ | f₁,₂ | f₂,₂ | ... | fₘ,₂ |
| ID 1 | t₃ | P₃ | ... | I₁,₃ | I₂,₃ | ... | Iₙ,₃ | f₁,₃ | f₂,₃ | ... | fₘ,₃ |
| ... | ... | ... | ... | ... | ... | ... | ... | ... | ... | ... | ... |
| ID K | tᵢ | Pᵢ | ... | I₁,ᵢ | I₂,ᵢ | ... | Iₙ,ᵢ | f₁,ᵢ | f₂,ᵢ | ... | fₘ,ᵢ |
| ID K | tⱼ | Pⱼ | ... | I₁,ⱼ | I₂,ⱼ | ... | Iₙ,ⱼ | f₁,ⱼ | f₂,ⱼ | ... | fₘ,ⱼ |
| ID K | tₖ | Pₖ | ... | I₁,ₖ | I₂,ₖ | ... | Iₙ,ₖ | f₁,ₖ | f₂,ₖ | ... | fₘ,ₖ |

210 — ID Tag(s)
220 — Tool Operation Information
230 — Spectral Intensity Information
240 — Wafer Measurement Information
200

FIG. 2

| ID Tags | | | Spectroscopic Data | | | | |
|---|---|---|---|---|---|---|---|
| WAFER ID | EQUIP. ID | TIME | I(l₁) | I(l₂) | ... | I(l_N) | STATUS |
| ID 1 | CH4 | t₁ | I₁₁ | I₁₂ | | I₁N | 1 |
| ID 1 | CH4 | t₂ | I₂₁ | I₂₂ | | I₂N | 1 |
| ID 1 | CH4 | t₃ | I₃₁ | I₃₂ | | I₃N | 1 |
| ⋮ | ⋮ | ⋮ | ⋮ | ⋮ | | ⋮ | ⋮ |
| ID K | CH1 | t₁ | I₁₁ | I₁₂ | | I₁N | 0 |
| ID K | CH1 | t₂ | I₂₁ | I₂₂ | | I₂N | 0 |
| ID K | CH1 | t₃ | I₃₁ | I₃₂ | | I₃N | 0 |
| ⋮ | ⋮ | ⋮ | ⋮ | ⋮ | | ⋮ | ⋮ |

800

| ID Tags | | | Sensor Data | Spectroscopic Data | | | | |
|---|---|---|---|---|---|---|---|---|
| WAFER ID | EQUIP. ID | TIME | PRESSURE | I(l₁) | I(l₂) | ... | I(l_N) | STATUS |
| ID 1 | CH4 | t₁ | P₁ | I₁₁ | I₁₂ | | I₁N | 1 |
| ID 1 | CH4 | t₂ | P₂ | I₂₁ | I₂₂ | | I₂N | 1 |
| ID 1 | CH4 | t₃ | P₃ | I₃₁ | I₃₂ | | I₃N | 1 |
| ⋮ | ⋮ | ⋮ | ⋮ | ⋮ | ⋮ | | ⋮ | ⋮ |
| ID K | CH1 | t₁ | P₁ | I₁₁ | I₁₂ | | I₁N | 0 |
| ID K | CH1 | t₂ | P₂ | I₂₁ | I₂₂ | | I₂N | 0 |
| ID K | CH1 | t₃ | P₃ | I₃₁ | I₃₂ | | I₃N | 0 |
| ⋮ | ⋮ | ⋮ | ⋮ | ⋮ | ⋮ | | ⋮ | ⋮ |

|WAFER ID|TIME|$I(l_P)$|$I(l_Q)$|...|STATUS|
|---|---|---|---|---|---|
|ID 1|$t_1$|$I_{1P}$|$I_{1Q}$|.|0|
|ID 1|$t_2$|$I_{2P}$|$I_{2Q}$|.|0|
|ID 1|$t_3$|$I_{3P}$|$I_{3Q}$|.|0|
|...|...|...|...|...|...|
|ID 1|$t_R$|$I_{RP}$|$I_{RQ}$|.|1|
|ID 1|$t_{R+1}$|$I_{(R+1)P}$|$I_{RQ}$|.|1|
|ID 1|$t_{R+2}$|$I_{(R+2)P}$|$I_{RQ}$|.|1|
|...|...|...|...|...|...|
|ID K|$t_1$|$I_{1P}$|$I_{1Q}$|.|0|
|ID K|$t_2$|$I_{2P}$|$I_{2Q}$|.|0|
|ID K|$t_3$|$I_{3P}$|$I_{3Q}$|.|0|
|...|...|...|...|...|...|

Columns $I(l_P)$ and $I(l_Q)$ comprise Spectral Intensity Information. Table labeled 1400.

FIG. 14

TOOL PERFORMANCE BY LINKING SPECTROSCOPIC INFORMATION WITH TOOL OPERATIONAL PARAMETERS AND MATERIAL MEASUREMENT INFORMATION

TECHNICAL FIELD

The subject disclosure relates to merging disparate information related to a semiconductor manufacturing process and autonomously learning tool performance improvements with the merged information.

BACKGROUND

On-going technological evolution of electronics and computing devices drives advances in semiconductor technology. In addition, growing consumer demand for smaller, higher performing, and more efficient computer devices and electronics has lead to a down scaling of semiconductor devices. In addition, to meet device demand while restraining costs, silicon wafers upon which semiconductor devices are formed have increased in size.

Fabrication plants working with large wafer sizes utilize automation to implement and control wafer processing. Such plants can be capital intensive and, accordingly, it is desirable to maintain highly efficient operation of fabrication equipment to minimize downtime and maximize yields. To facilitate these goals, measurement equipment can be employed to monitor fabrication equipment during wafer processing and acquire measurement information on both the equipment and the processed wafer. The measurement information can be analyzed to optimize fabrication equipment.

According to an example, the measurement information can include tool level information which indicates a state or condition of fabrication equipment or a portion thereof, wafer metrology information specifying physical and/or geometric conditions of wafers being processed, electrical text information, and the like. In addition, spectroscopic data, e.g., spectral line intensity information, can be gathered to facilitate identification of etch endpoints by process engineers. However, in conventional fabrication environments, various measurement data is handled independently of one another, for different purposes. Accordingly, inter-relationships among various measurement data are not leverage for advanced optimization of fabrication processes.

The above-described deficiencies of today's semiconductor fabrication measurement and optimization systems are merely intended to provide an overview of some of the problems of conventional systems, and are not intended to be exhaustive. Other problems with conventional systems and corresponding benefits of the various non-limiting embodiments described herein may become further apparent upon review of the following description.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of this summary is to present some concepts related to some exemplary non-limiting embodiments in a simplified form as a prelude to the more detailed description of the various embodiments that follow.

In one embodiment, spectroscopic data (e.g., spectral line intensities), sensor data, and material measurement data related to a semiconductor production tool can be acquired and consolidated into a data structure (e.g., a matrix). According to an example, sensor data can include performance counter measurements such as, but not limited to, elapsed time since wet-clean, age of one or more parts (e.g., age of focus ring, age of CEL, etc.), and the like. The data structure can be utilized as training data for a learning engine configured to generate expressions for a field of interest in terms of other fields of the data structure. For instance, an etch bias at a given location on a wafer can be expressed in terms of a chamber pressure, an intensity of a given wavelength (e.g., spectral line), a critical dimension measurement, or the like.

In another embodiment, the expressions can be leveraged to tune or optimize performance of the semiconductor production tool. For instance, based upon the expressions, operating ranges of configurable parameters of the tool, and target values for outputs, values for the configurable parameters can be identified to achieve the target outputs. The semiconductor production tool can be tuned in accordance with the values.

In yet another embodiment, the learning engine can be leveraged to identify influential characteristics of a first semiconductor production tool with high performance (e.g., high yields), where the influential characteristics operate to distinguish the first semiconductor production tool from other semiconductor production tools or underperforming chambers of the first semiconductor tool. A status field can be incorporated into the data structure and the learning engine can generate an expression for values of the status field based upon other fields in the data structure. From the expression, influential characteristics, e.g., variables in the expression, can be identified.

In a further embodiment, endpoint detection in etching steps can utilize mechanisms described herein. For instance, wavelengths, e.g., spectral lines, which are good predictors of endpoint conditions, can be identified. A status field is introduced which indicates a processed wafer is a good wafer, e.g., acceptable, or a bad wafer, e.g., unacceptable. The learning engine can generate an expression for status based upon the wavelengths identified as good predictors. A semiconductor production tool, e.g., an etching tool, can pass real-time information to the expression during wafer processing and halt etching when the expression predicts the status indicates a good wafer.

These and other embodiments are described in more detail below.

BRIEF DESCRIPTION OF THE DRAWINGS

Various non-limiting embodiments are further described with reference to the accompanying drawings in which:

FIG. 2 is an exemplary, non-limiting illustration of a data structure formed from an integration of spectral intensity information, tool operation information, and wafer measurement information according to one or more aspects; [Is it necessary to change FI-CD(1), FI-CD(2)... to CD(1), CD(2), etc. The rational being that FI-CD is typical of measurements after processing and we wish to ensure that we can take data about the wafer before entry into the process (e.g., DI-CD(1), DI-CD(2) . . . , and after exit from the process FI-CD(1), FI-CD(2), . . . . ]

FIG. 8 is an exemplary, non-limiting illustration of data structures employed as training matrices according to one or more aspects;

FIG. 14 is an exemplary, non-limiting illustration of a data structure employed as a training matrix according to one or more aspects;

DETAILED DESCRIPTION

Overview

Figure 1:
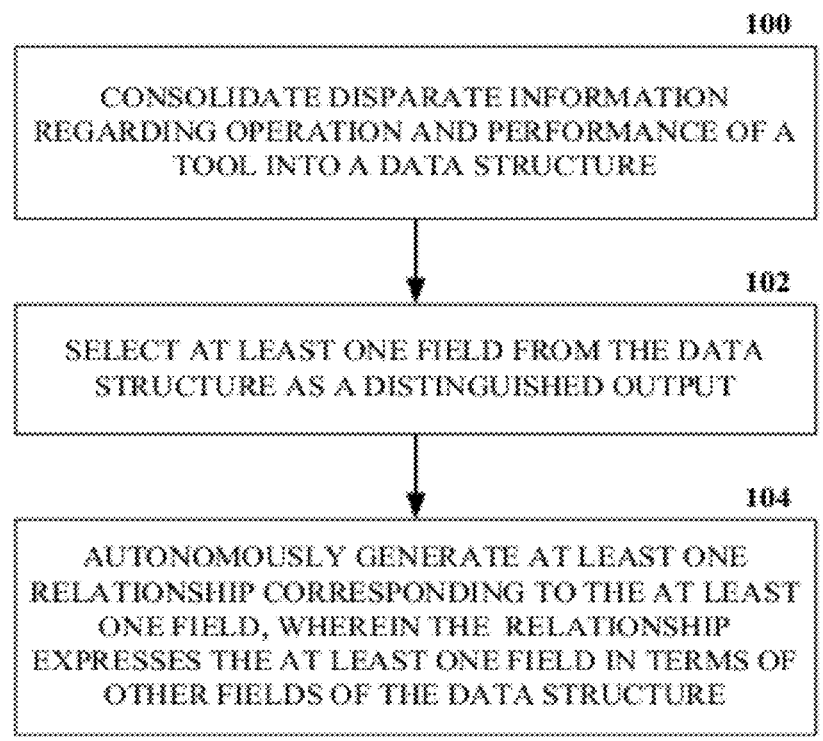
FIG. 1 is a flow diagram illustrating an exemplary, non-limiting embodiment for learning relationships among disparate information related to a semiconductor production tool.

As discussed in the background, a variety of information can be gathered from semiconductor production tools, also referred to herein as fabrication equipment, fabrication machines, semiconductor process equipment, semiconductor production equipment, tools, or other similar terminology derived from the foregoing. Such information can include tool operational data, e.g., data from sensors monitoring and/or integrated with tools; device measurement data, e.g., physical and geometric characteristics of a wafer; and spectroscopic data, e.g., intensities of wavelengths or spectral lines due to concentrations of various gas compounds within the tool. Conventionally, the individual types of information are independently analyzed and utilized for disparate purposes. Accordingly, interesting relationships between disparate types of information remain unnoticed.

Through integration or consolidation of the various types of information, such relationships can be leveraged to achieve optimal tool performance, improved tool control, and greater understanding of conditions of good yielding tools or tool components. Consolidation and analysis of disparate information enables hard to measure or infrequently measured features to be accurately predicted or inferred from more easily acquired metrics. For instance, wafer measurements such as, but not limited to, develop inspection critical dimension (DI-CD), final inspection critical dimension (FI-CD), layer thickness, etch bias, or the like, are typically taken prior to processing or subsequent to processing. As such, in-situ values of wafer measurements are typically unavailable during processing. However, integration of information and relationship learned through integration enable such wafer measurements to be expressed by quantities readily obtainable, in-situ, during wafer processing. For instance, such wafer measurements can be expressed in terms of spectral intensity information and/or tool operational data, which can be monitored in real-time.

In various, non-limiting embodiments, semiconductor production equipment can leverage a learning engine, which aggregates disparate types of information, e.g., operational information, measurement information, spectroscopic information, etc., and generates at least one expression for a given field, column, or variable of the aggregate information that describes a value for the given field in terms of other fields of the aggregate information. For instance, an expression for etch bias can be generated in terms of a gas pressure within a chamber of a tool; intensities of one or more spectral lines; a elapsed time in wafer processing; various wafer measurements, pre- or post-processing; etc. The generated one or more expressions can facilitate modeling of wafer processing to predict possible outcomes given modifications to configurable parameters such as gas flow, chamber pressure, upper radio frequency (RF) power, etc.

According to further embodiments, the generated one or more expressions can be employed to select values for configurable parameters to achieve output targets. For instance, parameter values can be selected to achieve an etch bias within acceptable limits. In another embodiment, expressions can be generated which predict whether a given tool or chamber within a tool offers high yield performance. Such expressions can facilitate identification of conditions of the tool or chamber that are good indicators of yield performance. Further, expression can be generated which identify when a good wafer is produced or a good etch on a wafer is achieved. Such expressions can be utilized in connection with real-time data to control an etching process, for example.

Herein, an overview of some of the embodiments for improving performance of semiconductor production equipment through linkage of disparate information has been presented above. As a roadmap for what follows next, various exemplary, non-limiting embodiments and features for autonomous learning of relationships and improving tool performance with the relationships are described in more detail. Then, some non-limiting implementations and examples are given for additional illustration, followed by representative network and computing environments in which such embodiments and/or features can be implemented.

Understanding Semiconductor Production Equipment Performance Through Integration of Spectroscopic Information, Sensor Information, and Measurement Information As mentioned above, in various embodiments, a semiconductor production tool can utilize a learning engine to consolidate disparate types of information into a single matrix of training data. The learning engine, based upon the matrix of training data, can autonomously generate at least one relationship that expresses a parameter of the matrix in terms of other parameters included in the matrix. The at least one relationship can be leveraged for "what-if?" analysis, equipment tuning or configuration, identification of conditions influencing yield performance, etch endpoint detection, and the like.

In a specific, non-limiting example, the semiconductor production tool can be a etch system configured to generate and control high-energy ions from a plasma to remove material from a wafer. An etching tool can include a plurality of plasma chambers independently processing different wafers. Within a chamber, highly reactive plasma gasses react with the wafer to remove a film, e.g., a layer of material, where a photoresist pattern leaves the film exposed. In the etch system, spectroscopy or other similar techniques (e.g., optical emission spectroscopy (OES), Fourier transform infrared spectroscopy (FTIR), laser induced fluorescence (LIF), etc.) can be utilized to detect gas compounds in a chamber as well as determine relative concentrations of disparate compounds. Typically, spectroscopy involves detecting light emitted from electron transitions occurring within atoms or molecules of the gas compounds with the chamber. Generally, different compounds emit light at different sets of wavelengths or spectral lines. Accordingly, a particular set of spectral lines detected can operate as a fingerprint to identify a particular compound. In addition, an intensity associated with the spectral lines can indicate a relative concentration of the compound.

With conventional fabrication processes, spectroscopic data, as described above, can be studied by a process engineer to identify and define endpoint conditions of an etch. Careful control of etching leads to better formed features on the wafer and, accordingly, to higher yields per wafer. For an etch intended to form a cavity in a material, the depth of the cavity can be controlled via etching time and a known etch rate. Some etches undercut a masking layer and form cavities with sloping sidewalls in the underlying material. The distance of undercutting is referred to etch bias or simply, bias. With conventional fabrication processes, the process engineer studies spectroscopic data to identify a good endpoint for an etch with the goal of etching a feature with a desirable critical dimension is formed while reducing bias as much as possible.

In accordance with an embodiment, spectroscopic data can be linked with disparate types of data such as sensor data (e.g., chamber pressures, gas flows, upper RF power, elapsed time, etc.) and wafer measurements (e.g., DI-CD, FI-CD, bias, thickness, etc.). Once linked, spectral intensities within a chamber can facilitate identification and prediction of favorable conditions which can improve tool performance. While aspects herein are described relative to etch systems, it is to be appreciated that etch systems are an exemplary environment to aide in explanation and description of various embodiments. Moreover, it will be appreciated that techniques described herein can be employed with other types of semiconductor production equipment beyond etch systems. For instance, equipment such as, but not limited to thermal processing equipment, coaters/developers, surface preparation systems, deposition systems, wafer probe systems, material modification or doping system, etc., can be improved with one or more embodiments herein.

With respect to one or more non-limiting ways to aggregate disparate information into a data structure and utilize the data structure to increase tool efficient and performance as described above, FIG. 1 shows a flow diagram illustrating an exemplary, non-limiting embodiment for learning relationships among disparate information related to a semiconductor production tool. At 100, disparate information regarding operation and performance of the semiconductor production tool is consolidated into a data structure. The data structure can be a matrix that incorporates spectral intensity information, tool operational information, and wafer measurement information. Spectral intensity information can include intensities of light at particular wavelengths or spectral lines as detected by a spectroscope or other similar measurement device. Tool operation information can include gas flows, chamber pressures, upper RF power, elapsed time, RF-Hours, age of tool parts (e.g., focus ring, CEL, MFC's) etc., as measured by sensor coupled with the semiconductor production tool. Further, wafer measurement information can include DI-CD, FI-CD, bias, thickness, etc. acquired by wafer metrology devices before and/or after a wafer processing step.

Turning briefly to FIG. 2, illustrated is an exemplary, non-limiting data structure 200 that incorporates spectral intensity information, tool operation information, and wafer measurement information. As shown in FIG. 2, data structure 200 can include a field 210 that specifies identification (ID) tags for a unit of processing. In the example of FIG. 2, the unit or processing is a wafer. Accordingly, field 210 includes Wafer IDs. In an embodiment data structure 200 can include information corresponding to K wafers, where K is an integer greater than or equal to one. Fields 220 of data structure 200 include tool operation information such as time which reports a number of seconds elapsed in a process. In an embodiment, the process can be partitioned into distinct steps, such that tool operation information can include an additional field, e.g., step ID (not shown), that indicates a step of the process from which other fields relate. In addition to process time and/or process steps associated with a process the semiconductor production tool implements, fields 220 can include sensor measurements such as chamber pressure, gas flows, upper RF power, etc. As shown in FIG. 2, the pressure field of fields 220 can include distinct pressure measurements (e.g., $P_1, P_2, P_3, \ldots$) corresponding to particular time increments of a process on a particular wafer denoted by Wafer ID field.

Fields 230 of data structure 200 include spectral intensity information. The spectral intensity information includes intensity values for N wavelengths of light, where N is an integer greater than or equal to one. Similar to sensor measurements described above, for a given wavelength, such as wavelength 1 ($\lambda_1$), fields 230 can include intensity measurements a ($I_{11}, I_{21}, I_{31}, \ldots$) corresponding to particular time increments of a process on a particular wafer denoted by Wafer ID.

Figure 3:
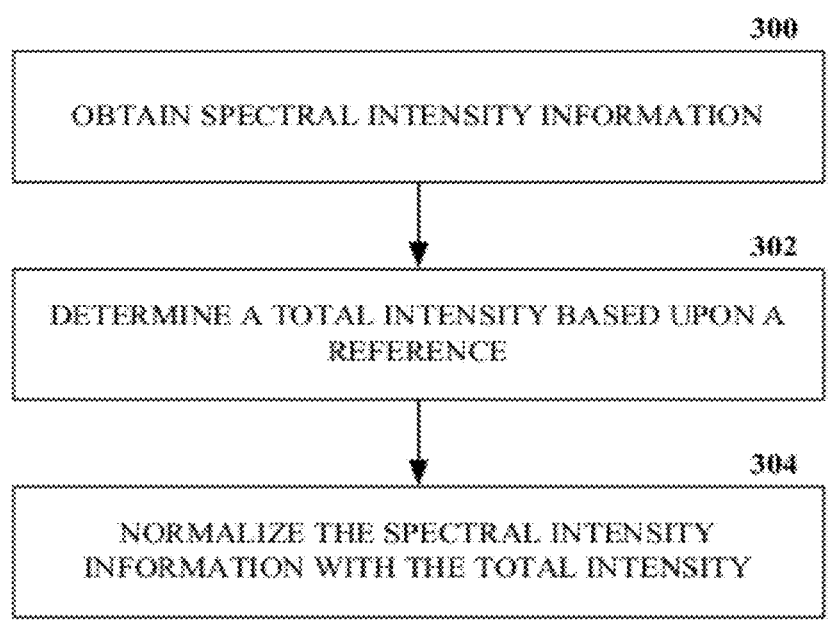
FIG. 3 is a flow diagram illustrating an exemplary, non-limiting embodiment for normalizing spectroscopic data prior to consolidation into a training matrix.

To account for typical measurement error of intensity of spectral lines in different tools, chambers of tools, etc., measured intensities can be normalized. Turning briefly to FIG. 3, a flow diagram of an exemplary, non-limiting embodiment for normalizing spectroscopic data prior to consolidation into a training matrix is illustrated. At 300, measured spectral intensity information is obtained. At 302, a total intensity is determined based upon a reference. For instance, the total intensity can be computed for some arbitrarily chosen reference tool or chamber. The total intensity, according to an embodiment, is determined by evaluating an integral of a spectrum over a wavelength range. For example, given a spectrum ranging in wavelength from 200 nanometers (nm) to 800 nm with a 0.5 nm resolution, the integral is evaluated as a sum of spectral intensity values multiplied by 0.5. At 304, the measured spectral intensity information is normalized with the total intensity. For instance, a normalized intensity value can correspond to a measured intensity value divided by the total intensity. It is to be appreciated that other normalizing techniques can be employed as well. For instance, normalizing spectral intensity can be accomplished by dividing a given set of intensity measurements at a wavelength by the peak measured magnitude of that intensity for each chamber.

As further depicted in FIG. 2, data structure 200 includes wafer measurement information in fields 240. While only FI-CD measurements are shown in fields 240, it is to be appreciated that fields 240 can include other wafer measurements such as bias measurements, DI-CD measurements, thickness measurements, and the like. Wafer measurements, such as FI-CD, can be acquired at multiple locations on the wafer. Accordingly, the numeral included in parentheses indicates a region of the wafer. As shown in FIG. 2, measurements can be taken at M regions of a wafer, where M is an integer greater than or equal to one. Wafer measurements are acquired before wafer processing or after wafer processing. Accordingly, for a given process step, wafer measurements are identical. For instance, assuming $t_1$, $t_2$, and $t_3$ correspond to time instants within the same process step on wafer ID 1, a FI-CD measurement at region 1 for time instants $t_1$, $t_2$, and $t_3$ is the same.

As shown in FIG. 2, total operation information, spectral intensity information, and wafer measurement information can be consolidated or aggregated in terms of wafer IDs, process time and/or process steps. For instance, the disparate information can be aligned in time or step and by wafer. Thus, a linkage is formed which enables various relationships to be derived as discussed below.

Turning back to FIG. 1, at 102, at least one field from the data structure (e.g., data structure 200) is selected as a distinguished output. For instance, the at least one field can be bias fields corresponding to a particular region, a subset of regions, or all regions. At 104, at least one relationship is autonomously generated, wherein the relationship corresponds to the at least one field and expresses the at least one field in terms of other fields of the data structure. In an embodiment, the at least one field (e.g., the distinguished output) can be selected by an agent (e.g., a software tool) in addition to being selected by a user (e.g., a tool operator, process engineer, etc.).

The data structure can be utilized as a training data matrix. The at least one relationship, for the selected field, can be learned via a genetic algorithm. However, it is to be appreciated that other types of learning can be implemented. For instance, the at least one relationship can be determined with linear approximation, multi-linear approximation, polynomial curve fitting, neural networks, or the like.

In a specific, non-limiting example, the at least one relationship can include an expression for etch bias at region 1 on a wafer. The expression can be denoted by the following:

$$bias_1 = f(pressure, \ldots, I(\lambda_1), \ldots, DI\text{-}CD(1), \ldots)$$

Where pressure is a chamber pressure of the tool, $I(\lambda_1)$ is a spectral intensity corresponding to a wavelength of $\lambda_1$, and DI-CD(1) is a DI-CD measurement at region 1. While the foregoing expression depicts only one sensor variable, one intensity variable, and one measurement variable, it is to be appreciated that the learned expression for $bias_1$ can include any number of sensor variables, intensity variables, and measurement variables illustrated in the expression by the ellipses.

Learning of relationships, such as the expression described above, can occur autonomously, without human intervention, such that expressions of the relationships are learned at substantially every measurement point in terms of related sensor variable, related spectral intensity variables, and related measurement variables. According to another, non-limiting example, spectral line intensity is typically a result of distinct gases in a tool chamber in distinct proportions. Accordingly, a particular spectral intensity at a wavelength can be a result of one gas in a chamber or many distinct gases in the chamber. Thus, the at least one relationship generated can be mapping between a spectral intensity at a wavelength and various gas flows, wherein the mapping can take the form of the following:

$$I(\lambda_1) = g(gas(1), gas(2), \ldots gas(n))$$

Where $\lambda_1$ represents a wavelength at which a spectral intensity, I, is expressed and gas(n) is a gas flow, in standard cubic centimeters per minute (sccm), for example, for gas n, where n is an integer greater than or equal to one.

Relationships learned for wafer attributes, e.g., wafer measurements, and wavelength intensities enable key insights into the behavior of a semiconductor production tool or a chamber of the semiconductor production tool. In addition, the relationships can be employed to perform "what-if?" style analysis. For instance, various questions can be readily answered; questions such as, "what happens to $I(\lambda_1)$ when a flow of gas 1 (e.g., gas(1)) is increased by one percent?", "what happens to bias(1), bias(2), . . . , bias(M) when gas(1) is increased by one percent?", "what happens to FI-CD(1) when pressure is increased by two percent?", "what happens to $I(\lambda_1)$ when upper RF power is increased by 50 watts?", etc.

Figure 4:
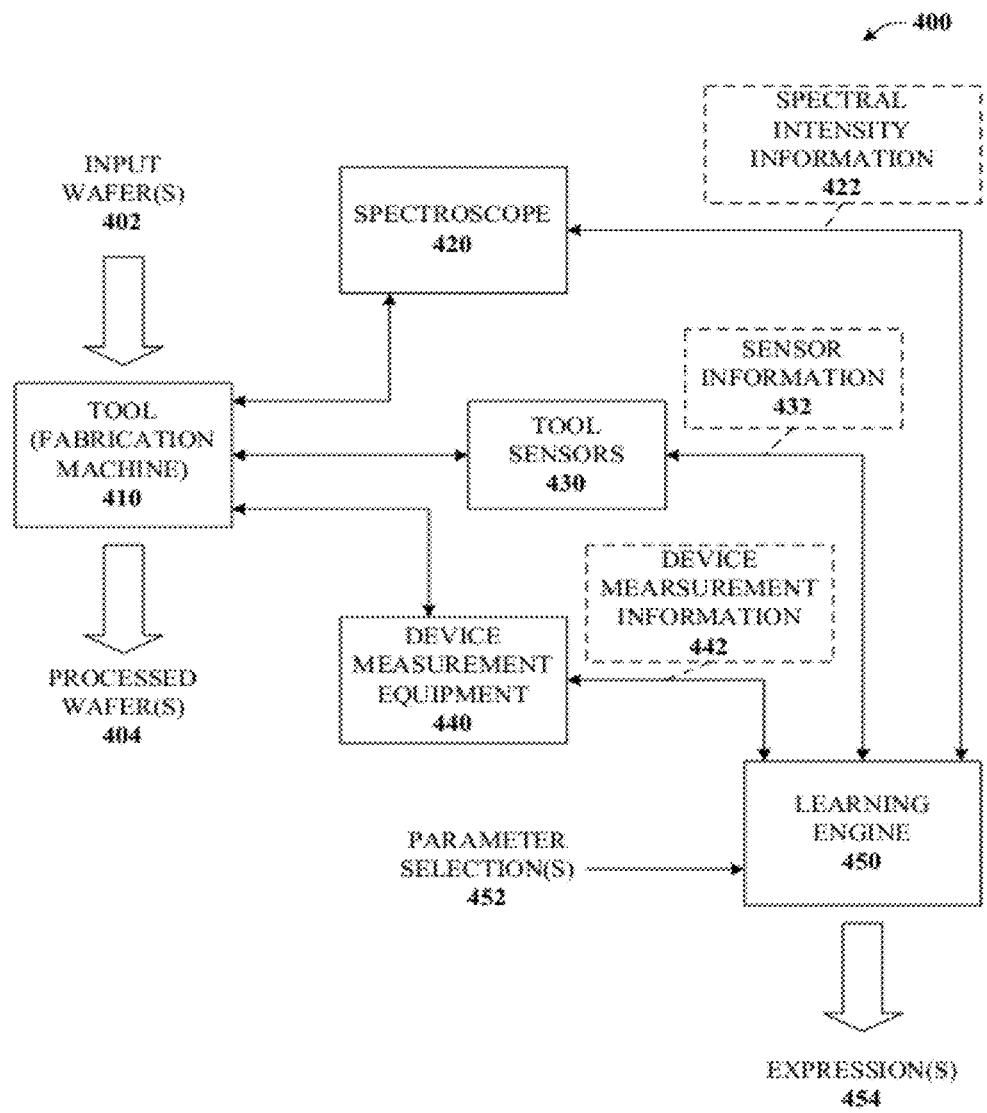
FIG. 4 is a block diagram illustrating an exemplary, non-limiting system for aggregating disparate information related to a semiconductor production tool and determining relationships therein.

FIG. 4 shows a block diagram illustrating an exemplary, non-limiting system 400 of aggregating disparate information related to a semiconductor production tool and determining relationships therein. As shown in FIG. 4, a tool 410 (also referred to as a fabrication machine, semiconductor production tool, semiconductor production equipment, etc.) can receive input wafers 402 and output processed wafers 404. In an exemplary, non-limiting embodiment, tool 410 can be a etch tool that removes unmasked material from input wafers 402 via an etching process (e.g., wet etch, dry etch, plasma etching, . . . ) to generate processed wafers 404 having cavities and features formed thereon.

A variety of measurement devices, such as spectroscope 420, tool sensors 430, and device measurement equipment 440, can monitor the process performed by tool 410 to acquire disparate information relating to various aspects, conditions, or results of the process. As an example, spectroscope 420 can acquire spectral intensity information 422 which includes a set of intensities for respective wavelengths or spectral lines observable by spectroscope 420. Spectral intensity information 422 can be time-series data such that spectroscope 420 measures intensities for respective wavelengths at regular intervals (e.g., every second, every 2 seconds, every 100 milliseconds, etc.). Spectroscope 420 can also correlate spectral intensity information 422 with wafer IDs associated with specific wafers processed by tool 410. Accordingly, spectroscope 420 can acquire spectral intensity information 422, individually, for each wafer in a set of wafers processed by tool 410.

Tool sensors 430 can monitor and measure tool operation characteristics while tool 410 processes wafers 402 and generate corresponding sensor information 432. Sensor information 432, similar to spectral intensity information 422, can be time-series data correlated on a per-wafer basis. Sensor information 432 can include measurements from a variety of sensors. Such measurements include pressures within one or more chambers of tool 410, gas flows for one or more distinct gases, temperature, upper RF power, elapsed time since last wet-clean, age of tool parts, and the like.

Device measurement equipment 440 can measure physical and geometric properties of wafers and/or features fabricated on wafers. For instance, device measurement equipment 440 can measure DI-CD, FI-CD, etch bias, thickness, and so forth, at predetermined locations or regions of wafers. The measured properties can be aggregated, on a per-location, per-wafer basis, as device measurement information 442. Properties of wafers are typically measured before processing or after processing. Accordingly, device measurement information 442 is time-series data acquired at a different interval as compared with spectral intensity information 422 and sensor information 432.

As shown in FIG. 4, spectral intensity information 422, sensor information 432, and device measurement information 442 can be input to a learning engine 450 configured to consolidate the disparate information into a unified matrix, such as data structure 200 described above with respect to FIG. 2. Also input to learning engine 450 is parameter selection 452, which specifies a variable, parameter, or field of the unified matrix. As the unified matrix is an integration of spectral intensity information 422, sensor information 432, and device measurement information 442, parameter selection 452 also acts to select a field, variable, or parameter from one of spectral intensity information 422, sensor information 432, or device measurement information 442. Learning engine 450 is further configured to learn a relationship between the field, variable, or parameter specified by parameter selection 452 and other fields in the unified matrix at every measurement point. In an embodiment, learning engine 450 generates at least one least one expression 454, which conveys the learned relationship. According to a non-limiting example, learning engine 450 implements a genetic algorithm to derive the relationship and, accordingly, expression 454. However, it is to be appreciated that learning engine 450 can employ other learning techniques.

Moreover, learning engine 450 can accept multiple parameter selections 452 as input and output multiple expressions, respectively. For example, parameter selection 452 can indicate a selection of all bias fields for all locations of a wafer. Parameter selections 452 can originate from an agent (e.g., a software utility or application) or a user (e.g., a tool operator, a process engineer, etc.). In response to input of parameters selections 452, learning engine 450 outputs respective expressions 454 representing bias at every location in terms of other fields of the unified matrix.

Further, while FIG. 4 depicts spectroscope 420, tool sensors 430, device measurement equipment 440, and learning engine 450 as distinct and separate components from tool 410, it is to be appreciated that such configuration is provided for purposes of explanation and is not intended to be limiting. For instance, another suitable configuration for system 400 integrates the various components within tool 410 to provide an all-in-one semiconductor production tool capable of self-monitoring, self-learning, and self-tuning.

Figure 5:
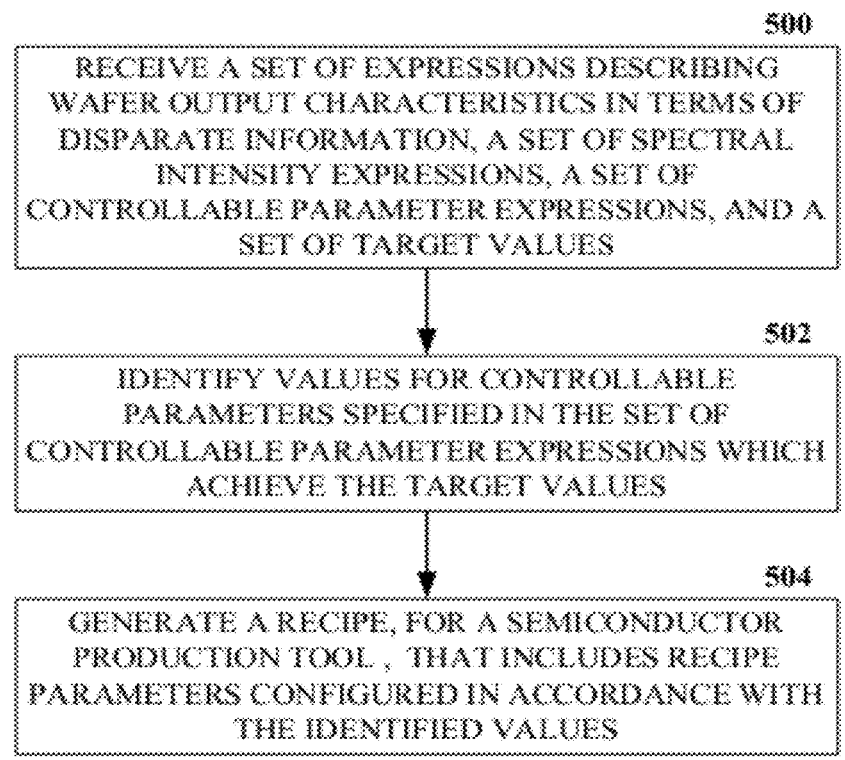
FIG. 5 is a flow diagram illustrating an exemplary, non-limiting embodiment for generating a recipe including optimized parameters identified based upon learned expressions from aggregate information.

Optimizing Semiconductor Production Equipment Performance with Learned Relationships Among Disparate Process Information As described above, spectroscopic information, sensor information, and measurement information related to semiconductor production equipment can be consolidated into a unified data structure to facilitate generated of learned expressions describing relationships among disparate data. In addition, to enabling an understanding of behaviors and performance of the semiconductor production equipment, the learned expressions can enable autonomous optimization, configuration, or tuning of the equipment. To this end, FIG. 5 illustrates a flow diagram of an exemplary, non-limiting embodiment for generating a recipe including optimized parameters identified based upon learned expressions from aggregate information. At 500, a variety of information is obtained. The information can include a set of expressions describing wafer output characteristics in terms of disparate information, a set of spectral intensity expressions characterizing intensity of spectral lines at particular wavelengths in terms of gas flows, a set of controllable parameter expressions which provide ranges and resolutions of configurable parameters of a semiconductor production tool, and a set of target values.

By way of a non-limiting example, the set of expressions describing wafer output characteristics can include a plurality of etch bias expressions, which are functions of other sensor data, wafer characteristics, and intensity information. For instance, the following expressions can be included in the set:

$$bias_1 = f_1(pressure, \ldots, I(\lambda_1), \ldots, DI\text{-}CD, \ldots)$$

$$bias_2 = f_2(pressure, \ldots, I(\lambda_1), \ldots, DI\text{-}CD, \ldots)$$

$$\ldots$$

$$bias_n = f_n(pressure, \ldots, I(\lambda_1), \ldots, DI\text{-}CD, \ldots)$$

Where $bias_n$ represents an etch bias at region n of a wafer, with n being an integer greater than or equal to 1, and $f_n$ represents a function that expresses a bias at region n in terms of other sensor information (e.g., pressure, gas flows, etc.), other spectral intensity information (e.g., $I(\lambda_1)$, $I(\lambda_2)$, etc.), and other measurement inputs (e.g., DI-CD at various regions, FI-CD at various regions, thickness at various regions, etc.).

The set of spectral intensity expressions can include one or more expressions of spectral intensity in terms of respective gas flows of a plurality of distinct gases in a chamber of the semiconductor production tool. Such expressions can take the form of the following, for example:

$$I(\lambda_1) = g_1(gas(1), gas(2), \ldots, gas(p))$$

$$I(\lambda_2) = g_2(gas(1), gas(2), \ldots, gas(p))$$

$$\ldots$$

$$I(\lambda_m) = g_m(gas(1), gas(2), \ldots, gas(p))$$

Where $I(\lambda_m)$ is an intensity value of a spectral line of wavelength m, where m is an index of wavelengths from a minimum up to a maximum at a predetermined resolution (e.g., wavelength 1 is 200 nanometers, wavelength m is 800 nanometers, and the resolution is 0.5 nanometers) and $g_m$ is an expression of intensity in terms of gas flows of p gases, where p is an integer greater than or equal to one.

The set controllable parameter expressions provide minimums, maximums, and resolutions of configurable parameters. For example, the set can include the following:
Pressure: Minimum: 80; maximum: 90; resolution: 1 milliTorr (mTorr)
Gas(1): Minimum: 10; maximum: 12; resolution 0.1 sccm
. . .
Upper RF Power: Minimum: 1400; maximum: 1600; resolution: 1 Watt
Where minimum specifies a smallest configurable value for a parameter, maximum specifies a largest configurable value for a parameter, and resolution indicates a minimum variation in a parameter which is supported by the semiconductor production tool.

The set of target values specify values for the output characteristics specified in the set of expressions. For example, for the bias expressions described above, the set of target values can include the following:

$$bias_1 = 40$$

$$bias_2 = 40$$

$$\ldots$$

$$bias_n = 40$$

While the above target values, in this example, are the same, it is to be appreciated that different values for each target can be specified. For instance, differences in target values, enables variation induced by prior processing tool can be compensated by the semiconductor production tool. As an example, where the semiconductor production tool is an etch tool, the target values can be different as DI-CD lines at edges of a wafer can be thicker, thus demanding a smaller etch bias as the edges.

At 502, values for the controllable parameters are identified, wherein the identified values achieve the target values. In an embodiment, the expression and target values described above can be input to an inverse problem solver, which utilizes a simulated annealing algorithm to identify values for the controllable parameters that allow the target values to be met. It is to be appreciated that other inverse problem solving techniques, such as simplex, gradient search, genetic algorithms, etc., can be employed in addition to or in place of the simulated annealing algorithm. At 504, a recipe is generated for the semiconductor production tool, wherein the recipe includes recipe parameters established in accordance with the identified values of the controllable parameters. The recipe can be executed by the semiconductor production tool to produce optimal wafer output.

Figure 6:
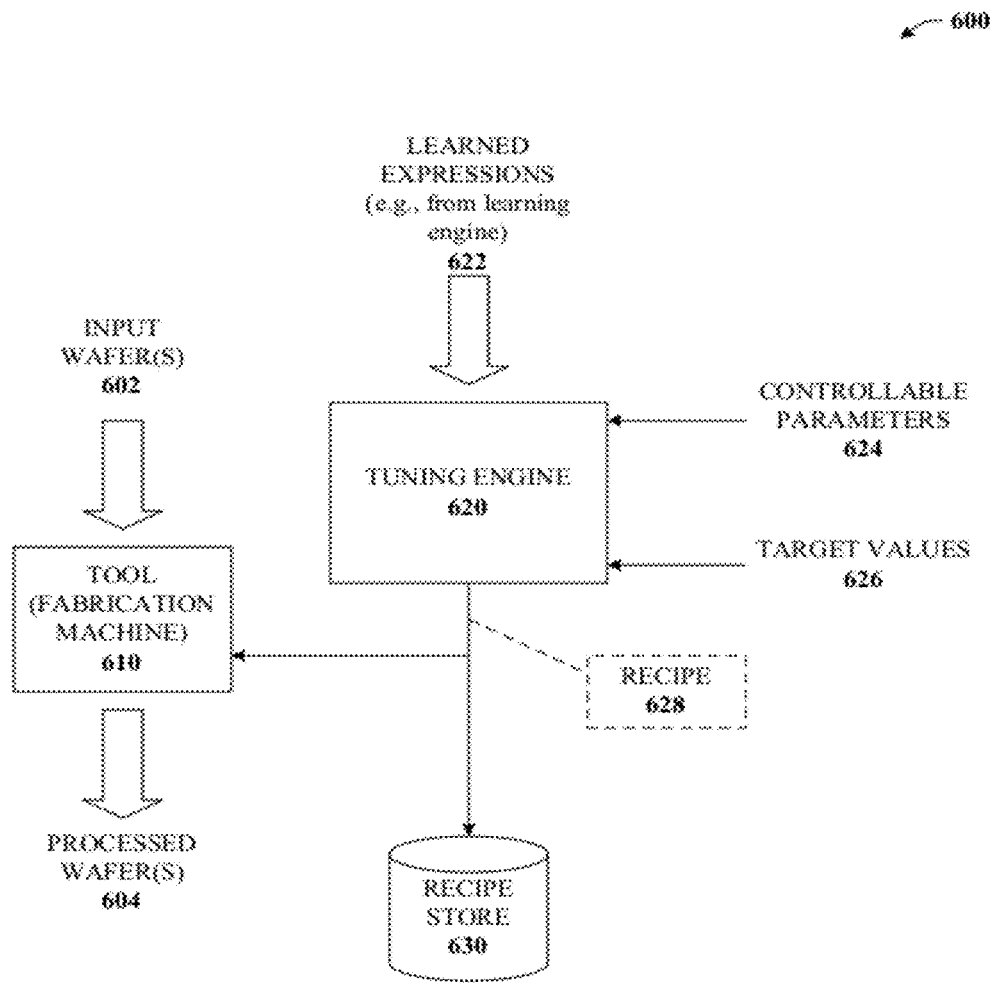
FIG. 6 is a block diagram illustrating an exemplary, non-limiting system for selecting values of configurable parameters which achieve target output values.

FIG. 6 shows a block diagram illustrating an exemplary, non-limiting system 600 of selecting values of configurable parameters which achieve target output values. As shown in FIG. 6, a tool 610 (also referred to as a fabrication machine, semiconductor production tool, semiconductor production equipment, etc.) can receive input wafers 602 and output processed wafers 604. In an exemplary, non-limiting embodiment, tool 610 can be a etch tool that removes unmasked material from input wafers 602 via an etching process (e.g., wet etch, dry etch, plasma etching, ...) to generate processed wafers 604 having cavities and features formed thereon.

In accordance with an embodiment, system 600 can include a tuning engine 620, which accepts learned expressions 622 as input. The learned expressions can be learned relationships generated by a learning engine, such as learning engine 450 described with respect to FIG. 4. Tuning engine 620 also obtains controllable parameters 624 and target values 626 as input. In an example, tuning engine 620 implements inverse problem solving techniques to identify suitable values of controllable parameters 624, which achieve target values 626, based upon the learned expressions 622. The identified values can be collected and output as a recipe 628, storable in recipe store 630 and employable by tool 610 to configure itself for optimal performance.

Identification of Important Conditions Influencing Good Yielding Chambers of a Semiconductor Production Tool As described above, learned expressions generated from integrated spectral information, sensor information, and measurement information facilitate identification of optimal configurations for a semiconductor production tool. However, in some circumstances an inverse situation can arise. For instance, for a set of semiconductor productions tools or a given semiconductor production tool with multiple processing chambers, it can be observed that one or more tools or chambers consistently outperforms other tools or chambers. Identification of conditions which influence a particular chambers ability to outperform other chambers can enable under-achieving chambers to be reconfigured and optimized.

Figure 7:
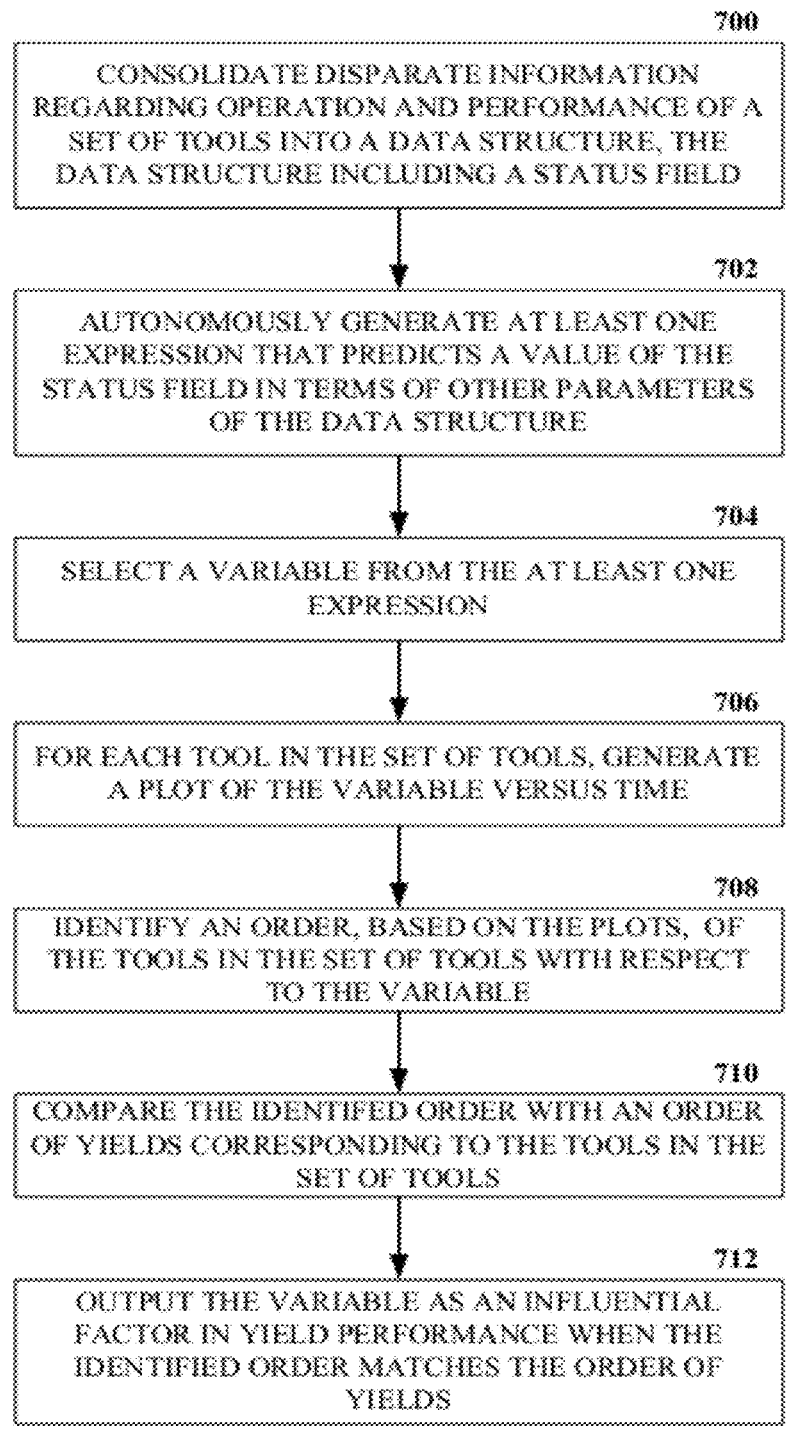
FIG. 7 is a flow diagram illustrating an exemplary, non-limiting embodiment for identifying influential conditions of high yield production equipment.

To this end, FIG. 7 shows a flow diagram illustrating an exemplary, non-limiting embodiment for identifying influential conditions of high yield producing equipment. At 700, disparate information regarding operation and performance of a set of tools (or a set of chambers of a tool) is consolidated. For instance, the disparate information can include spectral intensity information, tool operational information, and wafer measurement information, which is integrated into a data structure or unified matrix as described above. In addition, to the foregoing information, a performance status field can be incorporated into the data structure. The performance status field, in an embodiment, is set to a value of 1 for a best performing tool or chamber and is set to a value of 0 for all other tools or chambers included in the data structure. It is also to be appreciated that the performance status field can also be defined to be a real number indicative of the relative performance of a chamber instead of a Boolean status.

At 702, at least one expression is autonomously generated, wherein the at least one expression predicts the status of a chamber in terms of other parameters included in the data structure. According to one embodiment, the other parameters are spectral intensities only. In accordance with another embodiment a mixed-mode expression is generated such that the other parameters include spectral intensities and sensor information variables. When spectral intensities only are employed, training matrix 800 depicted in FIG. 8 is employed by a learning engine to drive the at least one expression that predicts the Status field shown in training matrix 800. In a mixed-mode, the learning engine can utilize training matrix 850, also shown in FIG. 8. As seen in FIG. 8, training matrices 800 and 850 include status fields, wafer ID fields, equipment ID fields (identifying a particular tool or chamber), and spectroscopic data. In the mixed-mode, sensor data is employed as well, so training matrix 850 further includes sensor data fields, such as pressure. To facilitate explanation, the following discussion describes examples where spectral intensities only are utilized to derive the at least one expression. However, it will be readily appreciated how the following techniques are extended to the mixed-mode which includes sensor data.

In a non-limiting example, the at least one expression can be a Boolean valued function, F, such as the following:

$$\text{Status}=F(I(\lambda_1), I(\lambda_2), \ldots, I(\lambda_m))$$

Pursuant to this example, Status is predicted based upon spectral intensity values for a set of m wavelengths or spectral lines, where m is an integer greater than or equal to one. The learning engine can be configured such that the number of intensity values included in the Boolean valued function, F, can be restricted to smaller number if only the largest contributors to status are desired.

Figure 9:
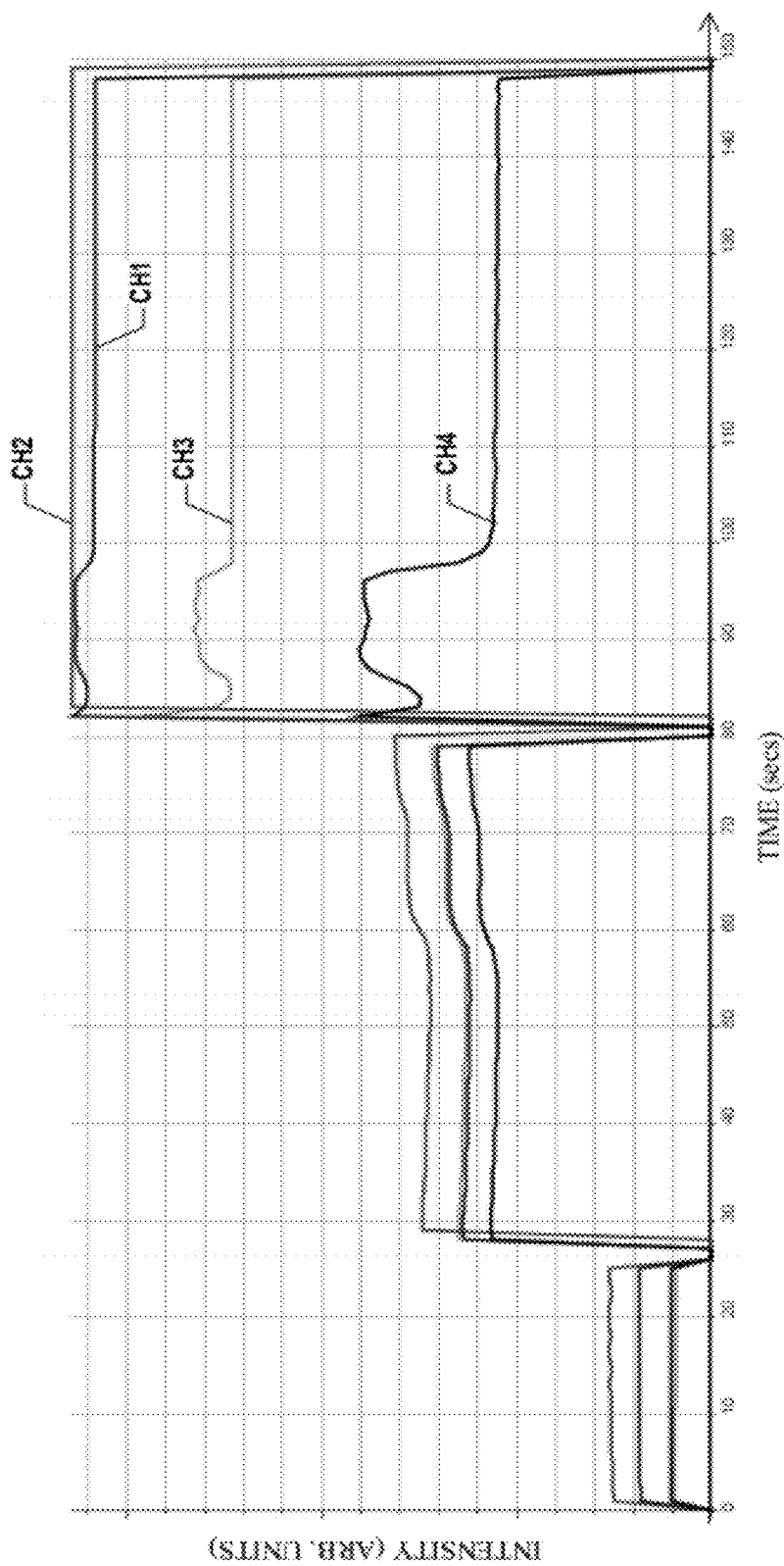
FIG. 9 is an exemplary, non-limiting illustration of a graph of intensity values over time for a plurality of chambers of a tool in accordance with one or more aspects.

At 704, a variable from the at least one expression is selected. At 706, a plot of the selected variable is generated for each tool or chamber. FIG. 9 illustrates such a plot of an intensity of a spectral line for four chambers of a tool (CH1 through CH4). At 708, an order is identified, based on the plots. The order is an order of the tools or chambers with respect to the selected variables. For example, in FIG. 9, the order can be (1) CH4, (2) CH3, (3) CH1, and (4) CH2. At 710, the identified order is compared with an order of yields corresponding to the tools or chambers. At 712, the variable is output as an influential factor in yield performance when the identified order matches the order of yields.

Figure 10:
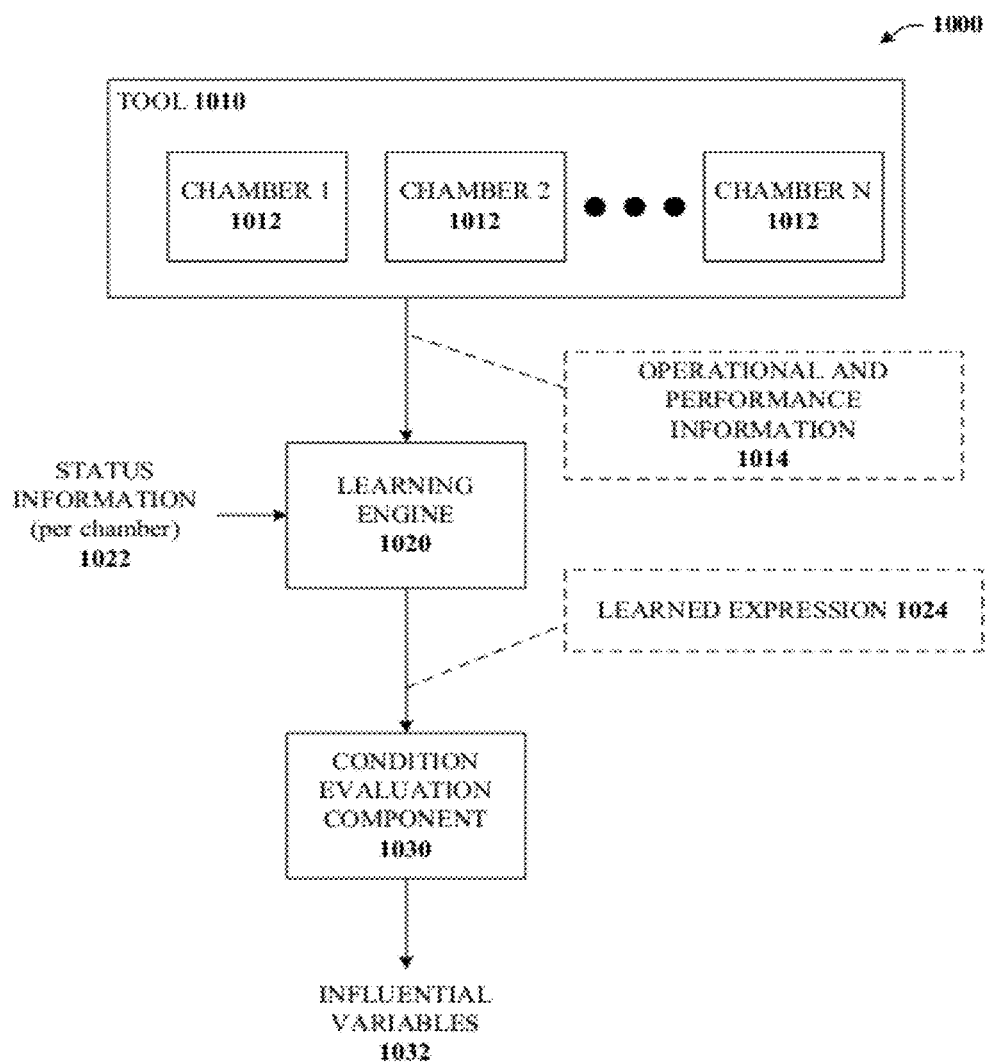
FIG. 10 is a block diagram of an exemplary, non-limiting system for determining influential variables which affect yield performance.

FIG. 10 shows a block diagram of an exemplary, non-limiting system 1000 for determining influential variables which affect yield performance. As shown in FIG. 10, a tool 1010 can include one or more chambers 1012. Chambers 1012 can individually and independently process input wafers and produce output wafers. For example, chambers 1012 can be distinct plasma chambers of an etch tool.

In accordance with an embodiment, system 1000 includes a learning engine 1020 which obtains operational and performance information 1014 from tool 1010 (or measurement devices associated with tool 1010) and status information 1022 per chamber. The learning engine 1020 can generate a training matrix from operational and performance information 1014. Learning engine 1020 can further incorporate status information 1022 into the training matrix. In an embodiment, status information 1022 indicates a status of 1 for a good performing chamber among chambers 1012 and indicates a status of 0 for the remaining chambers.

Learning engine 1020 outputs a learned expression for a status in terms of fields or variables included in the training matrix. The learned expression 1024 is input to a condition evaluation component 1030 which identifies influential variables 1032, included in the learned expression 1024, which are instrumental in determining yield performance of a chamber among chambers 1012.

Autonomous Endpoint Detection

As discussed above, in conventional fabrication processes, spectroscopic data (e.g., spectral intensity information) can be studied by a process engineer to identify and define endpoint conditions of an etch. Careful control of etching leads to better formed features on the wafer and, accordingly, to higher yields per wafer. For an etch intended to form a cavity in a material, the depth of the cavity can be controlled via etching time and a known etch rate. Some etches undercut a masking layer and form cavities with sloping sidewalls in the underlying material. The distance of undercutting is referred to etch bias or simply, bias. With conventional fabrication processes, the process engineer studies spectroscopic data to identify a good endpoint for an etch with the goal of etching a feature with a desirable critical dimension is formed while reducing bias as much as possible. However, even through careful study, it is not always possible to identify wavelengths that can be used for endpoint detection.

Figure 11:
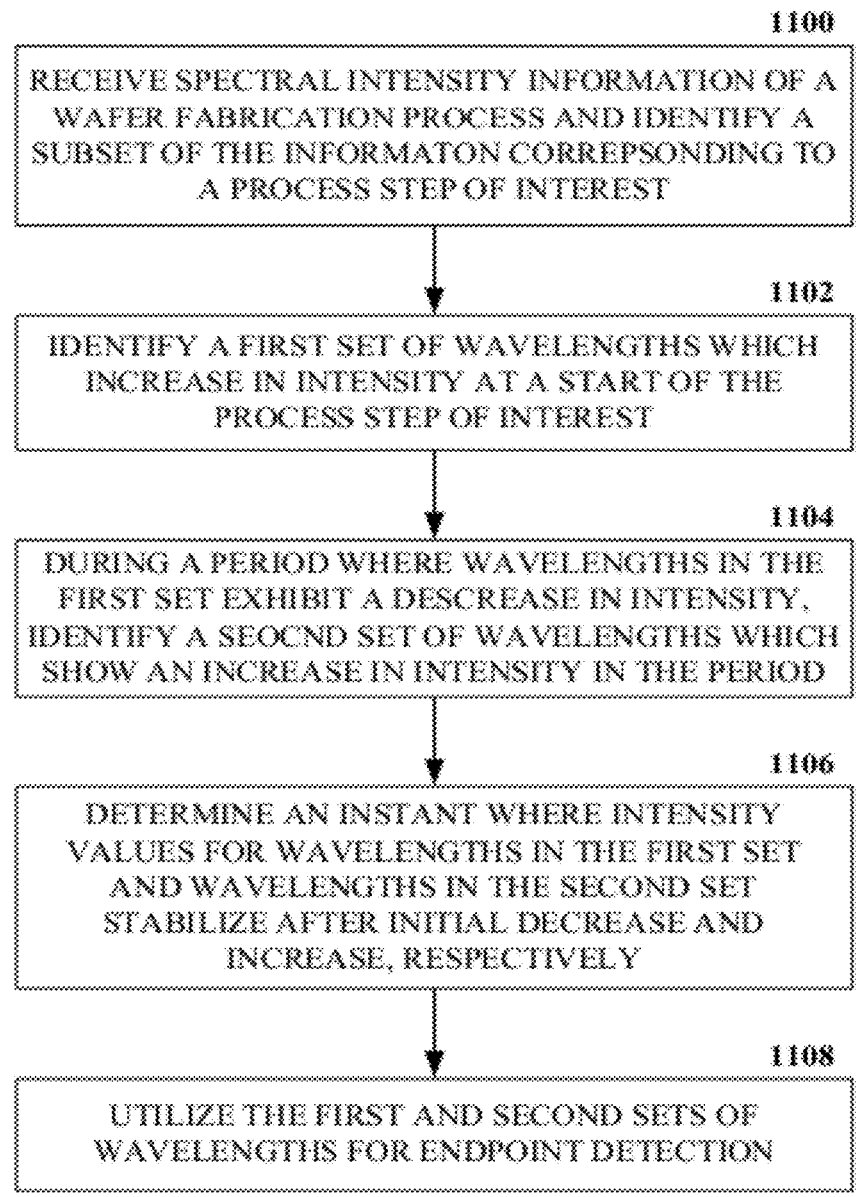
FIG. 11 is a flow diagram illustrating an exemplary, non-limiting embodiment for identifying one or more sets of wavelengths suitable for endpoint detection during an etching process.

In an embodiment, wavelengths or spectral lines, whose intensities are good indicators of endpoint conditions are autonomous identified. Such spectral lines can be employed in connection with learned expressions to facilitate automatic endpoint detection and etching control. With respect to one or more non-limiting ways to identify endpoint spectral lines and to detect endpoint conditions, FIG. 11 illustrates a flow diagram of an exemplary, non-limiting embodiment for identifying one or more sets of wavelengths suitable for endpoint detection during an etching process. At 1100, spectral intensity information of a wafer fabrication process is received and a subset of the information, corresponding to a process step of interest, is identified. For example, spectral intensity information can be associated with an entire wafer fabrication process, whereas the process step of interest corresponds to an etch step. Accordingly, a portion of the spectral intensity information corresponding to the etch step is identified.

Figure 12:
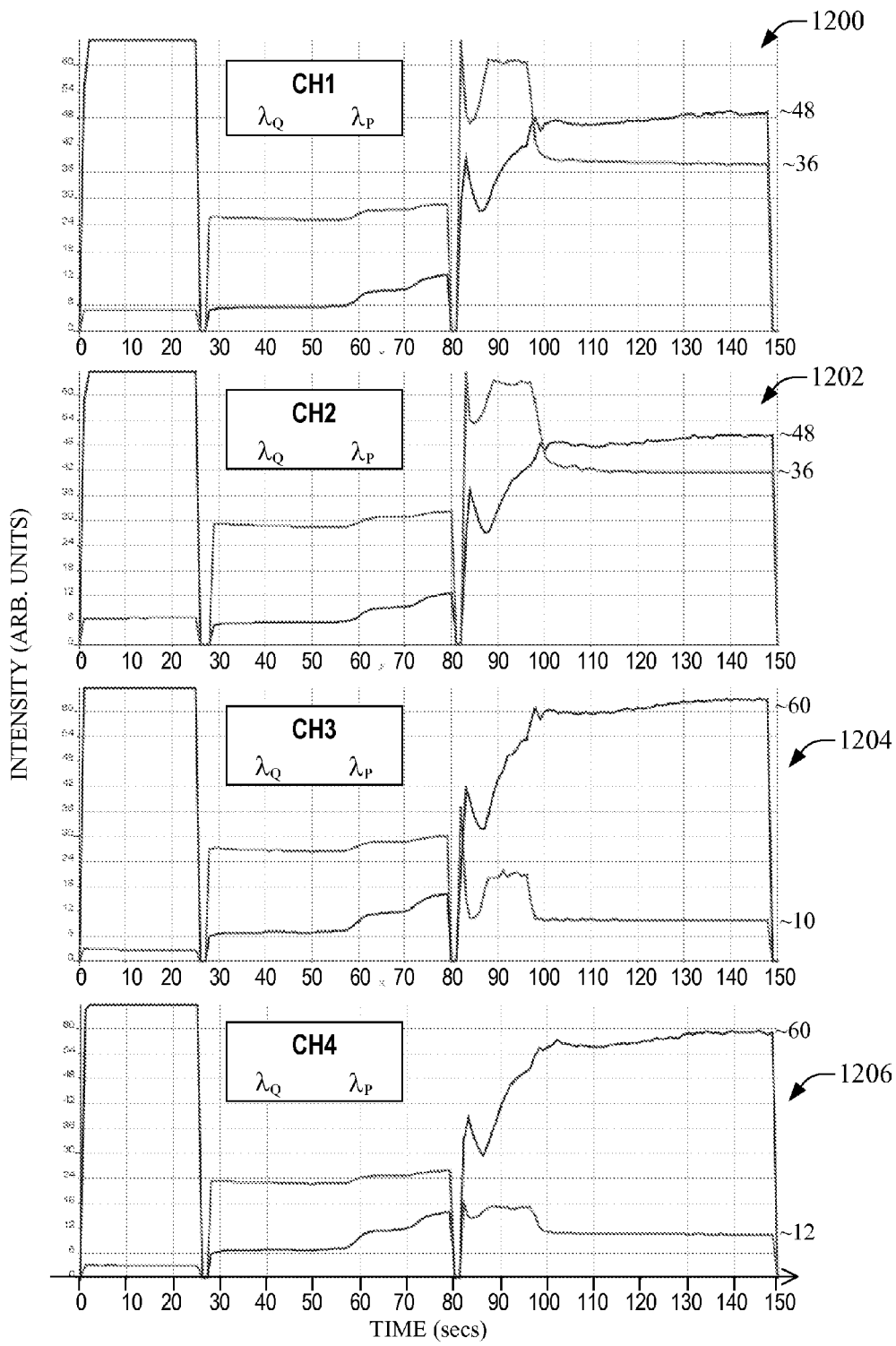
FIG. 12 is an exemplary, non-limiting illustration of graphs, for a plurality of chambers of a tool, of a pair of wavelengths whose corresponding intensities are plotted versus time.

At 1102, within the subset of the spectral intensity information, a first set of wavelengths is identified. The first set of wavelengths or spectral lines include those wavelengths with intensities that increase at a start of the process step of interest (e.g., an increase in intensity at a beginning portion of the subset of information). At 1104, during a period of the process step of interest where wavelengths in the first set exhibit a decrease in intensity, a second set of wavelengths is identified which show an increase in intensity in the period. According to an example, the second set of wavelengths correspond to emissions from by-product compounds in an etching chamber. At 1106, an instant (e.g., time instant) is identified where intensity values for wavelengths in the first set and intensity values for wavelengths in the second set stabilize (or cross-over) after initial decrease and increase, respectively. The stabilization (or cross-over) is illustrated in graphs 1200 through 1206 of FIG. 12, which show intensities of two wavelengths or spectral lines for each of four chambers. Such an instant of stabilization, if identified, indicates the first and second sets of wavelengths are suitable for endpoint detection as the endpoint of etching corresponds to when intensities stabilize or cross-over. At 1108, the first and second sets of wavelengths are utilized for endpoint detection.

Figure 13:
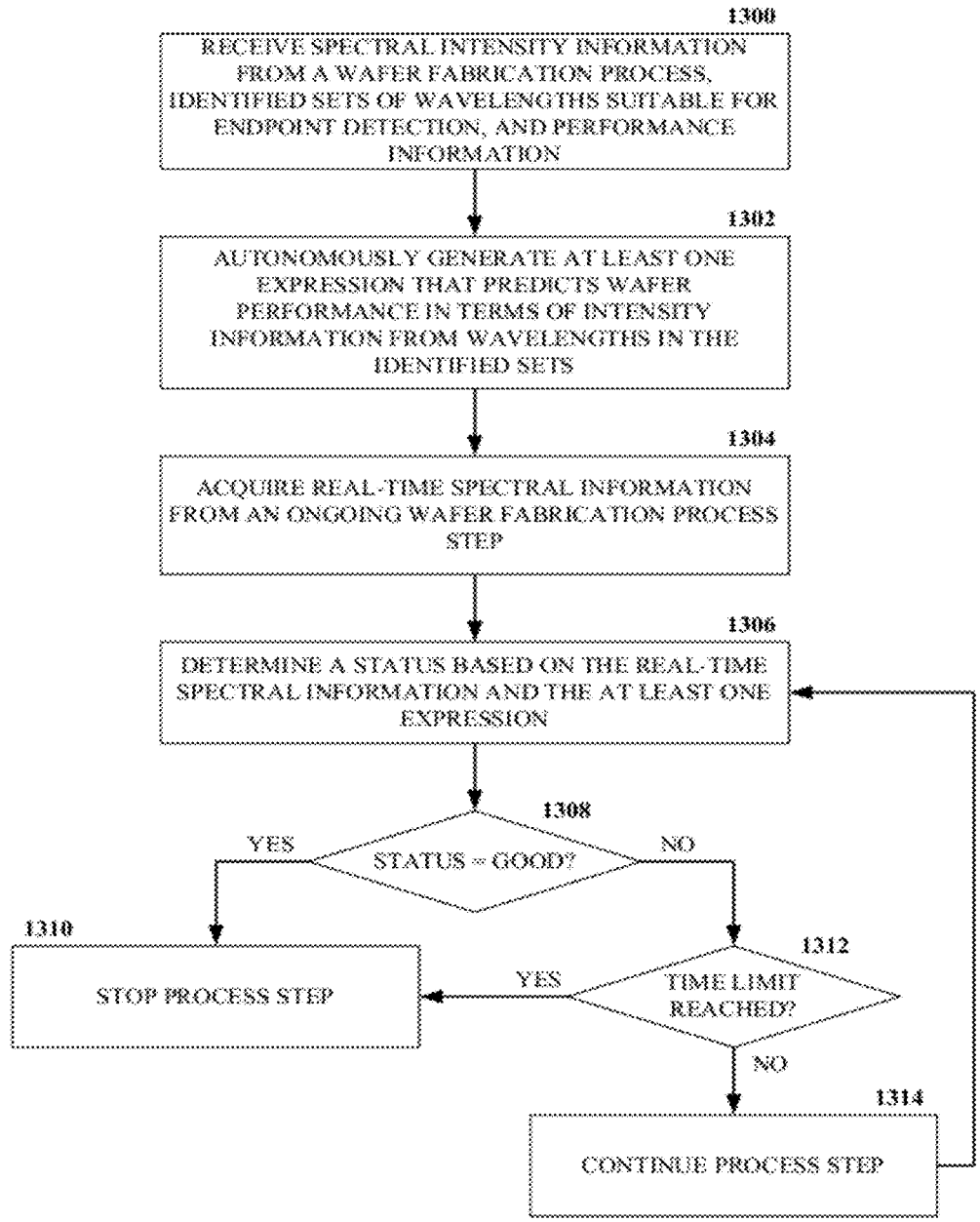
FIG. 13 is a flow diagram illustrating an exemplary, non-limiting embodiment for autonomous, learning-based endpoint detection and process control.

FIG. 13 illustrates a flow diagram of an exemplary, non-limiting embodiment for autonomous, learning-based endpoint detection and process control. At 1300, spectral intensity information from a wafer fabrication process, identified sets of wavelengths suitable for endpoint detection, and performance information are received. According to an example, the spectral intensity information can be time-series data of intensities for a plurality of spectral lines observed during a semiconductor production step, such as an etching step. The set of wavelengths suitable for endpoint detection can be identified in accordance with the embodiment described above with respect to FIG. 11. Further, performance information can be acquired by an operator or process engineer. Performance information indicates wafers where fabrication performance was good. Such performance information can be integrated with the spectral intensity information to form training matrix 1400 illustrated in FIG. 14. The status column, shown in FIG. 14, can be integrated as follows. For a good wafer (e.g., a wafer with well-formed features and good yields, such as wafer $ID_1$ of training matrix 1400), the value of the status field is initially zero and, subsequently, is one when wavelengths in the identified sets stabilize or cross-over. Thus, for good wafers, the status column is initially zero and become one after the endpoint reached. For a wafer exhibiting poor results, the status column has a value of zero for all time instants At 1302, at least one expression is autonomously generated. The at least one expression predicts wafer performance in terms of intensity information corresponding to wavelengths in the identified sets of wavelengths. The at least one expression can be generated by a learning engine (e.g., employing a genetic algorithm or other suitable learning technique) based upon training matrix 1400. At 1304, real-time spectral information from an ongoing wafer fabrication process step is acquired. At 1306, a status is determined based on the real-time spectral information and the at least one expression. At 1308, a determination is made as to whether the status is good. If yes, at 1310, the process step is stopped as the endpoint is reached. If no, at 1312, a determination is made as to whether a maximum time limit has elapsed. If yes, the process step is stopped at 1310. If no, the process step is continued at 1314, and a new status is determined at 1306. Accordingly, the fabrication process step is monitored in this manner until either a good status is determined or a maximum time elapses.

Figure 15:
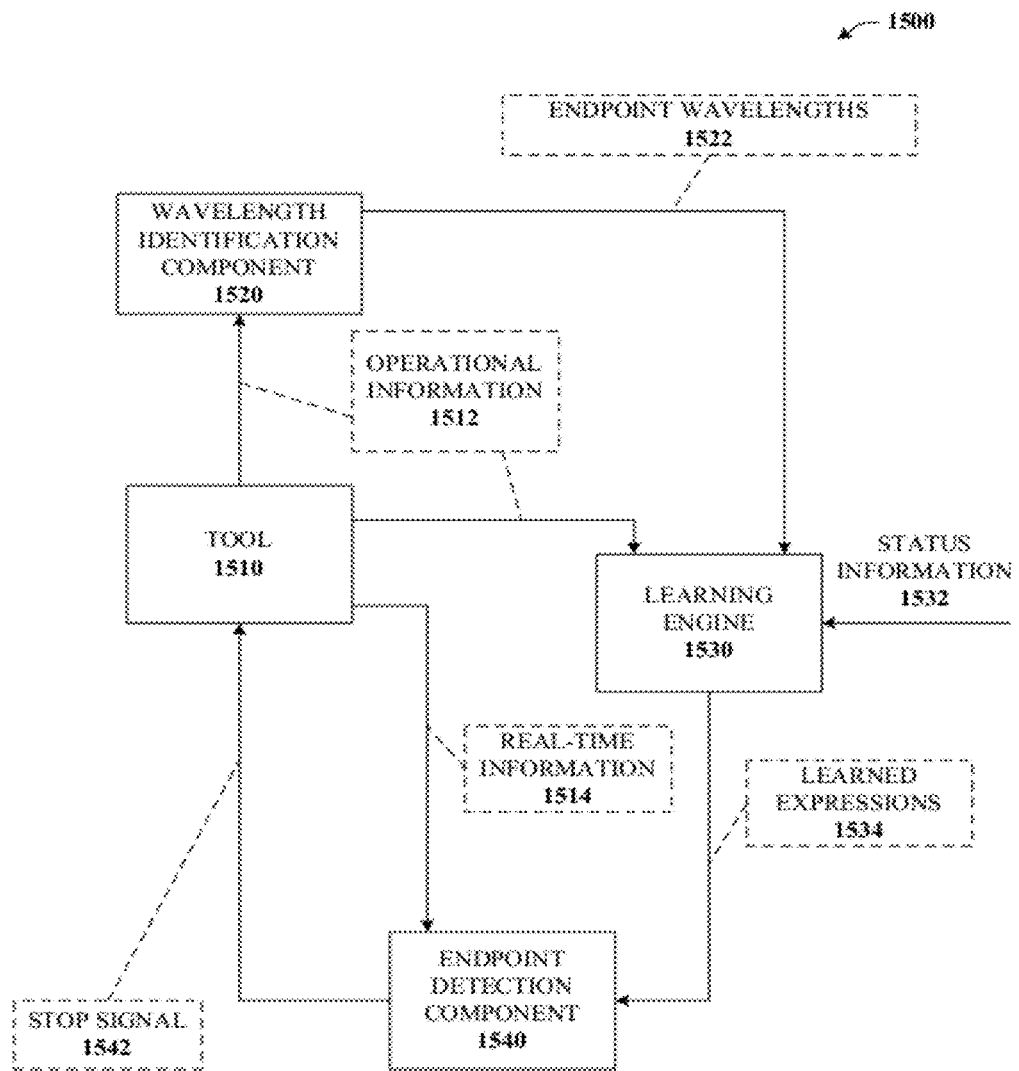
FIG. 15 is a block diagram illustrating an exemplary, non-limiting system for endpoint detection during a wafer etch process.

FIG. 15 illustrates a block diagram of an exemplary, non-limiting system 1500 for endpoint detection during a wafer etch process. As shown in FIG. 10, a tool 1510 (e.g., a semiconductor production tool such as an etch tool) can provide operational information 1512 to a wavelength identification component 1520. The operational information includes spectral intensity information corresponding to process steps performed on one or more wafers. The wavelength identification component 1520 outputs endpoint wavelengths 1522 based upon the operational information 1512.

System 1500 includes a learning engine 1530 which obtains operational information 1512 from tool 1510 (or measurement devices associated with tool 1510), endpoint wavelengths 1522, and status information 1532. The learning engine 1530 can generate a training matrix from operational information 1512. Learning engine 1530 can further incorporate status information 1532 into the training matrix as depicted in FIG. 14. Learning engine 1530 outputs a learned expression 1534 for a status in terms of intensities of endpoint wavelengths 1522. The learned expression 1534 is input to an endpoint detection component 1540 which also accepts real-time information 1514 from tool 1510. Based upon the learned expression 1534 and the real-time information 1514, endpoint detection component 1540 can be configured to send a stop signal 1542 to tool 1510 when a endpoint is detected or when a maximum time expires as described above with respect to FIG. 13.

The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used, for the avoidance of doubt, such terms are intended to be inclusive in a manner similar to the term "comprising" as an open transition word without precluding any additional or other elements when employed in a claim.

As mentioned, the various techniques described herein may be implemented in connection with hardware or software or, where appropriate, with a combination of both. As used herein, the terms "component," "engine," "system" and the like are likewise intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on computer and the computer can be a component. One or more components may reside within a process and/or thread of execution and a component may be localized on one computer and/or distributed between two or more computers.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nanoscale architectures such as, but not limited to, molecular and quantum-dot based transistors, switches and gates, in order to optimize space usage or enhance performance of user equipment. A processor may also be implemented as a combination of computing processing units.

In the subject specification, terms such as "store," "storage," "data store," data storage," "database," "repository," and substantially any other information storage component relevant to operation and functionality of a component, refer to "memory components," or entities embodied in a "memory" or components comprising the memory. It will be appreciated that the memory components described herein can be either volatile memory or nonvolatile memory, or can include both volatile and nonvolatile memory.

By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Various aspects or features described herein may be implemented as a method, apparatus as either hardware or a combination of hardware and software or hardware and firmware, or article of manufacture using standard programming and/or engineering techniques. Implementation(s) as a method, or as a combination of hardware and software, for example, can be effected at least in part through a processor or processing unit (e.g., processing platform 385) that executes computer-accessible code instructions retained in a memory. In one or more aspects, the functions described may be implemented in hardware, software, firmware, or any combination thereof. If implemented in software, the various functionality described herein can be stored or transmitted as one or more instructions or code on a computer-readable storage medium or memory. Computer-readable media includes both computer storage media and communication media including any medium that facilitates transfer of a computer program from one place to another. A storage medium may be any available media that can be accessed by a computer. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disc, digital versatile disc (DVD) . . . ], smart cards, and flash memory devices (e.g., card, stick, key drive . . . ).

Various aspects of the subject disclosure can be implemented by processor(s) or computing devices including the processor(s). The computing device typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the terms "includes" or "including" are used in either the detailed description or the claims, such term is intended to be inclusive in a manner similar to the terms "comprises" or "comprising" as "comprises" or "comprising" is interpreted when employed as a transitional word in a claim.

The aforementioned systems have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it can be noted that one or more components may be combined into a single component providing aggregate functionality or divided into several separate sub-components, and that any one or more middle layers, such as a management layer, may be provided to communicatively couple to such sub-components in order to provide integrated functionality. Any components described herein may also interact with one or more other components not specifically described herein but generally known by those of skill in the art.

In view of the exemplary systems described supra, methodologies that may be implemented in accordance with the described subject matter can also be appreciated with reference to the flowcharts of the various figures. While for purposes of simplicity of explanation, the methodologies are shown and described as a series of blocks, it is to be understood and appreciated that the various embodiments are not limited by the order of the blocks, as some blocks may occur in different orders and/or concurrently with other blocks from what is depicted and described herein. Where non-sequential, or branched, flow is illustrated via flowchart, it can be appreciated that various other branches, flow paths, and orders of the blocks, may be implemented which achieve the same or a similar result. Moreover, some illustrated blocks are optional in implementing the methodologies described hereinafter.

In addition to the various embodiments described herein, it is to be understood that other similar embodiments can be used or modifications and additions can be made to the described embodiment(s) for performing the same or equivalent function of the corresponding embodiment(s) without deviating therefrom. Still further, multiple processing chips or multiple devices can share the performance of one or more functions described herein, and similarly, storage can be effected across a plurality of devices. Accordingly, the invention is not to be limited to any single embodiment, but rather is to be construed in breadth, spirit and scope in accordance with the appended claims.

What is claimed is:

1. A method, comprising:
   integrating disparate information related to a semiconductor production tool into a data structure comprising at least three fields, wherein the at least three fields comprise at least a first field that contains spectroscopic intensity information, a second field that contains tool operation information, and a third field that contains wafer measurement information;
   selecting a field of the at least three fields as a distinguished output; and
   learning, by a learning engine comprising a processor, and based on the data structure, at least one relationship that characterizes the field in terms of one or more other fields of the at least three fields, wherein the spectroscopic intensity information comprises at least one of an intensity of light at a defined wavelength or a spectral line detected by a spectroscope, the method further comprising normalizing the spectroscopic intensity information prior to use by the learning engine, wherein the normalizing comprises:
   measuring the spectroscopic intensity information; and
       determining a total intensity of the spectroscopic intensity information based on a reference, wherein the total intensity is determined as a function of resolution of values within the spectroscopic intensity information over a wavelength range.

2. The method of claim 1, wherein the tool operation information comprises at least one of a measurement of a physical quantity or maintenance information, wherein the measurement of the physical quantity comprises a measurement of at least one of a pressure, a gas flow, or a power, and wherein the maintenance information comprises at least one of an elapsed time since a most recent wet-clean or an age of a tool part.

3. The method of claim 1, wherein the learning the at least one relationship comprises:
   generating an expression for an intensity of a spectral line as a function of a set of gas flows corresponding to respective gases; and
   identifying at least one of a mass flow control (MFC) drift or a shift error in response to a determination, based on the expression, that a predicted value of a spectral intensity does not match a measured value of the spectral intensity.

4. The method of claim 1, wherein the learning the at least one relationship comprises generating an expression for the field as a function of the one or more other fields, and wherein the field represents a wafer output characteristic and the one or more other fields relate to one or more of a tool sensor measurement, a spectral intensity measurement, or a wafer input characteristic.

5. The method of claim 1, further comprising receiving selection input that facilitates selection of the field for which the at least one relationship is to be learned.

6. The method of claim 1, wherein the learning the at least one relationship comprises employing a genetic algorithm to generate the at least one relationship.

7. The method of claim 1, wherein the adjusting the operation of the semiconductor production tool comprises:
receiving a set of controllable parameter expressions, wherein a controllable parameter expression, of the set of controllable parameter expressions, specifies a minimum value of a controllable parameter, a maximum value of the controllable parameter, and a minimum value by which the controllable parameter is allowed to change;
receiving a set of target values, wherein a target value of the set of target values represents a wafer output characteristic; and
determining an operating parameter for the semiconductor production tool based upon the at least one relationship, the set of controllable parameter expressions, and the set of target values.

8. The method of claim 7, further comprising creating a recipe that includes the operating parameter, wherein the determining the operating parameter comprises determining the operating parameter using an inverse problem solving technique.

9. The method of claim 1, further comprising identifying one or more influential variables of the data structure determined to contribute to acceptable wafer yields.

10. The method of claim 1, further comprising:
receiving status information, wherein the status information specifies a state of respective chambers of the semiconductor production tool as one of a good chamber or a poor chamber; and
integrating the status information into the data structure.

11. The method of claim 10, further comprising learning a Boolean-valued function that predicts the state of a chamber of the semiconductor production tool based on at least one of the spectroscopic intensity information in the data structure or the tool operation information in the data structure.

12. The method of claim 11, further comprising:
for a parameter of the Boolean-valued function:
ordering chambers of the semiconductor production tool by corresponding values of the parameter to yield a first order;
ordering the chambers of the semiconductor production tool by yield performance to yield a second order; and
identifying the parameter as an influential variable in response to a determination that the first order matches the second order.

13. The method of claim 1, further comprising:
identifying a first set of wavelengths associated with a first set of intensities in the spectroscopic intensity information that increase during an etch step performed by the semiconductor production tool;
identifying a second set of wavelengths associated with a second set of intensities in the spectroscopic intensity information that decrease during the etch step; and
selecting a first wavelength from the first set of wavelengths and a second wavelength from the second set of wavelengths for detection of an endpoint.

14. The method of claim 13, further comprising:
augmenting first intensity values, from the spectroscopic intensity information and associated with a plurality of wafers, corresponding to the first wavelength and the second wavelength with state information that specifies respective states of the plurality of wafers; and
learning a Boolean-valued function that predicts a state of a wafer based upon second intensity values associated with the wafer and corresponding to the first wavelength and the second wavelength.

15. The method of claim 14, further comprising halting the etch step of the semiconductor production tool in response to a determination that the Boolean-valued function predicts a change in the state of the wafer from a defined poor state to a defined good state.

16. A system for a semiconductor production tool, comprising:
a memory storing computer executable components; and
a processor configured to execute the following computer executable components stored in the memory:
a learning engine configured to integrate tool operation information, spectral intensity information, and device measurement information related to the semiconductor production tool—into a first field, a second field, and a third field, respectively, of a unified training data structure, and, based on selection of a distinguished field of the first field, the second field, or the third field, utilize the unified training data structure to generate an expression for prediction of a first value of the distinguished field based upon one or more second values of respective one or more other fields of the first field, the second field, or the third field,
wherein the spectral intensity information comprises at least one of an intensity of light at a defined wavelength or a spectral line detected by a spectroscope, the method further comprising normalizing the spectral intensity information prior to use by the learning engine, wherein the normalizing comprises: measuring the spectral intensity information; and
determining a total intensity of the spectral intensity information based on a reference, wherein the total intensity is determined as a function of resolution of values within the spectral intensity information over a wavelength range.

17. The system of claim 16, further comprising a tuning engine configured to:
obtain a set of controllable parameter expressions, wherein a controllable parameter expression, of the set of controllable parameter expressions, specifies a minimum value of a controllable parameter, a maximum value of the controllable parameter, and a minimum value by which the controllable parameter is permitted to change;
obtain a set of target values, wherein a target value of the set of target values represents the wafer output characteristic; and
select a controller parameter value for the controllable parameter in accordance with at least one of the set of controllable parameter expressions, wherein the controller parameter value, according to the expression generated by the learning engine, is determined to achieve the target values.

18. A non-transitory computer-readable medium having stored thereon computer-executable instructions that, in response to execution, cause a device comprising a processor to perform operations, comprising:
consolidating disparate information related to a semiconductor production tool into a data structure comprising a set of fields, wherein the set of fields comprises at least a first field that stores spectroscopic intensity information, a second field that stores tool operation information, and a third field that stores wafer measurement information;
receiving selection of one field of the set of fields; and
generating at least one relationship that characterizes a first value of the one field in terms of one or more second values of one or more other fields of the set of fields,
wherein the spectroscopic intensity information comprises at least one of an intensity of light at a defined wavelength or a spectral line detected by a spectroscope, the method further comprising normalizing the spectroscopic intensity information prior to use by the learning engine, wherein the normalizing comprises:
measuring the spectroscopic intensity information; and
determining a total intensity of the spectroscopic intensity information based on a reference, wherein the total intensity is determined as a function of resolution of values within the spectroscopic intensity information over a wavelength range.

19. The non-transitory computer-readable medium of claim 18, wherein the operations further comprise modifying an operation of the semiconductor production tool based on the at least one relationship.

* * * * *